(12) United States Patent
Narita et al.

(10) Patent No.: US 11,800,027 B2
(45) Date of Patent: Oct. 24, 2023

(54) HOUSING, OPTICAL SCANNER, AND IMAGE FORMING APPARATUS

(71) Applicants: Susumu Narita, Tokyo (JP); Takeshi Yamakawa, Kanagawa (JP); Yoshinobu Sakaue, Kanagawa (JP); Ryo Sato, Tokyo (JP); Makoto Noda, Tokyo (JP)

(72) Inventors: Susumu Narita, Tokyo (JP); Takeshi Yamakawa, Kanagawa (JP); Yoshinobu Sakaue, Kanagawa (JP); Ryo Sato, Tokyo (JP); Makoto Noda, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 10 days.

(21) Appl. No.: 17/669,348

(22) Filed: Feb. 10, 2022

(65) Prior Publication Data

US 2022/0294926 A1 Sep. 15, 2022

(30) Foreign Application Priority Data

Mar. 12, 2021 (JP) ................................ 2021-040724

(51) Int. Cl.
*H04N 1/00* (2006.01)
*G03G 15/04* (2006.01)
(Continued)

(52) U.S. Cl.
CPC ... *H04N 1/00551* (2013.01); *G03G 15/04036* (2013.01); *G03G 21/1666* (2013.01);
(Continued)

(58) Field of Classification Search
CPC ........... H04N 1/00551; H04N 1/00557; H04N 1/113; G03G 15/04036; G03G 21/1666;
(Continued)

(56) References Cited

U.S. PATENT DOCUMENTS 8,908,380 B2 * 12/2014 Ohhashi ................. H05K 5/006
361/752
9,340,336 B2 * 5/2016 Mullaney ........... B65D 21/0227
(Continued)

FOREIGN PATENT DOCUMENTS

DE       10348358 A1 *  5/2005  ........... H05K 5/0013
JP      2007-180397       7/2007
(Continued)

*Primary Examiner* — Ryan D Walsh
(74) *Attorney, Agent, or Firm* — Duft & Bornsen, PC (57) ABSTRACT

A housing includes a body having an opening. The body includes a peripheral portion that abuts on the opening. A cover covers at least a part of the opening. A seal is sandwiched between the cover and the peripheral portion of the body. At least one of the cover and the peripheral portion of the body includes a corner portion and a linear portion. The corner portion has a first shape that defines one of a gap between the cover and the peripheral portion of the body and a width of the seal. The linear portion abuts on the corner portion. The linear portion has a second shape that defines the one of the gap between the cover and the peripheral portion of the body and the width of the seal. The second shape is different from the first shape of the corner portion.

12 Claims, 8 Drawing Sheets

(51) Int. Cl.
    *H05K 5/06*     (2006.01)
    *H05K 5/03*     (2006.01)
    *G03G 21/16*     (2006.01)
    *H04N 1/113*     (2006.01)
    *H01R 13/52*     (2006.01)

(52) U.S. Cl.
    CPC ......... *H04N 1/00557* (2013.01); *H04N 1/113* (2013.01); *H05K 5/03* (2013.01); *H05K 5/06* (2013.01); *H05K 5/062* (2013.01); *H05K 5/063* (2013.01); *H01R 13/5202* (2013.01)

(58) Field of Classification Search
    CPC   H05K 5/03; H05K 5/06; H05K 5/062; H05K 5/063; H01R 13/5202
    See application file for complete search history.

(56) References Cited

U.S. PATENT DOCUMENTS

| | | | | |
|---|---|---|---|---|
| 9,906,663 | B2* | 2/2018 | Otsubo | G03G 15/04036 |
| 10,274,858 | B2* | 4/2019 | Fukuhara | G03G 21/1666 |
| 2009/0168133 | A1 | 7/2009 | Narita | |
| 2011/0199664 | A1* | 8/2011 | Serizawa | G02B 26/12 359/205.1 |
| 2016/0147193 | A1* | 5/2016 | Yoshida | G03G 15/04036 399/107 |
| 2016/0231690 | A1 | 8/2016 | Yoshida et al. | |
| 2017/0257964 | A1* | 9/2017 | Ishikawa | H05K 5/0017 |
| 2021/0318536 | A1 | 10/2021 | Sakaue et al. | |

FOREIGN PATENT DOCUMENTS

| | | |
|---|---|---|
| JP | 2015-075654 | 4/2015 |
| JP | 2016-148702 | 8/2016 |
| JP | 2017-053958 | 3/2017 |

* cited by examiner

HOUSING, OPTICAL SCANNER, AND IMAGE FORMING APPARATUS

CROSS-REFERENCE TO RELATED APPLICATION

This patent application is based on and claims priority pursuant to 35 U.S.C. § 119(a) to Japanese Patent Application No. 2021-040724, filed on Mar. 12, 2021, in the Japan Patent Office, the entire disclosure of which is hereby incorporated by reference herein.

BACKGROUND

Technical Field

Exemplary aspects of the present disclosure relate to a housing, an optical scanner, and an image forming apparatus, and more particularly, to a housing, an optical scanner incorporating the housing, and an image forming apparatus incorporating the housing or the optical scanner.

Discussion of the Background Art

Related-art image forming apparatuses, such as copiers, facsimile machines, printers, and multifunction peripherals (MFP) having two or more of copying, printing, scanning, facsimile, plotter, and other functions, typically form an image on a recording medium according to image data.

Such image forming apparatuses include a housing including a body, a cover, and a seal. The body has an opening. The cover covers an entirety or a part of the opening. The seal is sandwiched between the cover and a peripheral portion of the body, which abuts on the opening.

SUMMARY

This specification describes below an improved housing. In one embodiment, the housing includes a body having an opening. The body includes a peripheral portion that abuts on the opening. A cover covers at least a part of the opening. A seal is sandwiched between the cover and the peripheral portion of the body. At least one of the cover and the peripheral portion of the body includes a corner portion and a linear portion. The corner portion has a first shape that defines one of a gap between the cover and the peripheral portion of the body and a width of the seal. The linear portion abuts on the corner portion. The linear portion has a second shape that defines the one of the gap between the cover and the peripheral portion of the body and the width of the seal. The second shape is different from the first shape at at least one of a first position disposed on the peripheral portion of the body and a second position that is disposed on the cover and disposed opposite the first position.

This specification further describes an improved optical scanner. In one embodiment, the optical scanner includes a light source that emits a light beam, a deflector that deflects the light beam, and the housing described above that accommodates the light source and the deflector.

This specification further describes an improved image forming apparatus. In one embodiment, the image forming apparatus includes an image bearer that bears an image and the housing described above that is disposed opposite the image bearer.

BRIEF DESCRIPTION OF THE DRAWINGS

A more complete appreciation of the embodiments and many of the attendant advantages and features thereof can be readily obtained and understood from the following detailed description with reference to the accompanying drawings, wherein.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

A description is provided of a construction of a copier 500, serving as an image forming apparatus incorporating a housing, according to an embodiment of the present disclosure.

Figure 1:
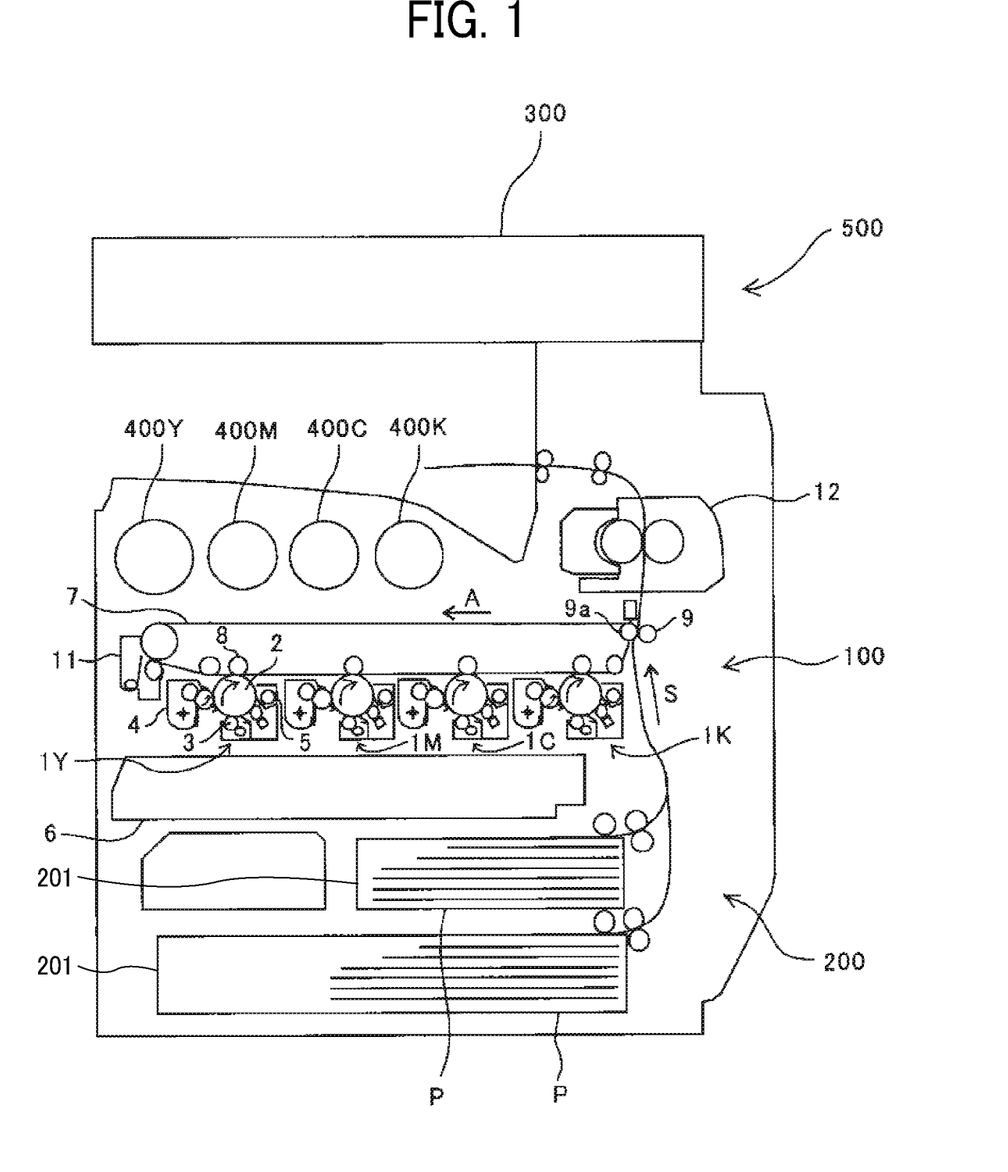
FIG. 1 is a schematic cross-sectional view of a copier according to an embodiment of the present disclosure.

FIG. 1 is a schematic cross-sectional view of the copier 500. The copier 500 includes a printer portion 100 (e.g., an apparatus body of the copier 500), a sheet feeder 200 (e.g., a sheet feeding table), and a scanner 300 mounted on the printer portion 100.

The printer portion 100 includes four process cartridges 1Y, 1M, 1C, and 1K (e.g., four process units), an intermediate transfer belt 7, an optical writing unit 6 serving as an exposure device, and a fixing device 12. The intermediate transfer belt 7 serves as an intermediate transferor that is stretched taut across a plurality of tension rollers and rotates in a rotation direction A.

Suffixes Y, M, C, and K of the four process cartridges 1Y, 1M, 1C, and 1K indicate yellow, magenta, cyan, and black, respectively. The four process cartridges 1Y, 1M, 1C, and 1K have substantially similar constructions, respectively, except that the four process cartridges 1Y, 1M, 1C, and 1K use toners in different colors, that is, yellow toner, magenta toner, cyan toner, and black toner.

Each of the process cartridges 1Y, 1M, 1C, and 1K includes a photoconductor 2 serving as a latent image bearer, a charger 3, a developing device 4, and a photoconductor cleaner 5 serving as a cleaner. Each of the process cartridges 1Y, 1M, 1C, and 1K is a unit that combines and supports the photoconductor 2, the charger 3, the developing device 4, and the photoconductor cleaner 5.

The photoconductor 2 rotates clockwise in a direction indicated with an arrow in FIG. 1. The charger 3 is pressed against a surface of the photoconductor 2 and rotates in accordance with rotation of the photoconductor 2. The charger 3 charges the surface of the photoconductor 2 when the copier 500 receives an image forming job.

The optical writing unit 6 exposes the surface of the photoconductor 2 according to image data created by the scanner 300 that reads an image on an original or image data input by an external device such as a client computer, thus forming an electrostatic latent image on the surface of the photoconductor 2. The optical writing unit 6 includes the housing according to embodiments of the present disclosure described below in detail. The photoconductor cleaner 5 removes residual toner failed to be transferred onto the intermediate transfer belt 7 and therefore remaining on the surface of the photoconductor 2 therefrom after a toner image formed on the photoconductor 2 passes through a primary transfer nip formed between the photoconductor 2 and the intermediate transfer belt 7.

The four process cartridges 1Y, 1M, 1C, and 1K form yellow, magenta, cyan, and black toner images on the photoconductors 2, respectively. The four process cartridges 1Y, 1M, 1C, and 1K are arranged in the rotation direction A of the intermediate transfer belt 7. The yellow, magenta, cyan, and black toner images formed on the photoconductors 2, respectively, are transferred onto the intermediate transfer belt 7 such that the yellow, magenta, cyan, and black toner images are superimposed on the intermediate transfer belt 7 successively. Thus, a visible image is formed on the intermediate transfer belt 7.

A primary transfer roller 8 serving a primary transfer device is disposed opposite the photoconductor 2 of each of the process cartridges 1Y, 1M, 1C, and 1K via the intermediate transfer belt 7. As a primary transfer bias is applied to the primary transfer roller 8, the primary transfer roller 8 forms a primary transfer electric field at the primary transfer nip formed between the photoconductor 2 and the intermediate transfer belt 7. The primary transfer electric fields transfer the yellow, magenta, cyan, and black toner images formed on the surfaces of the photoconductors 2, respectively, onto a surface of the intermediate transfer belt 7. The primary transfer rollers 8 successively transfer the yellow, magenta, cyan, and black toner images formed on the surfaces of the photoconductors 2, respectively, onto the surface of the intermediate transfer belt 7 that rotates in the rotation direction A such that the yellow, magenta, cyan, and black toner images are superimposed on the intermediate transfer belt 7, thus, forming a full color toner image on the surface of the intermediate transfer belt 7.

A secondary transfer roller 9 is disposed downstream from the primary transfer nips formed between the four process cartridges 1Y, 1M, 1C, and 1K and the intermediate transfer belt 7, respectively, in the rotation direction A of the intermediate transfer belt 7. The secondary transfer roller 9 is disposed opposite a secondary transfer opposed roller 9a serving as one of the tension rollers via the intermediate transfer belt 7. Thus, a secondary transfer nip is formed between the secondary transfer roller 9 and the intermediate transfer belt 7. The copier 500 applies a predetermined voltage at the secondary transfer nip formed between the secondary transfer roller 9 and the intermediate transfer belt 7 by the secondary transfer opposed roller 9a, thus forming a secondary transfer electric field.

A transfer sheet P serving as a transfer material is fed from one of sheet feeding trays 201 of the sheet feeder 200 and conveyed in a sheet conveyance direction S, reaching the secondary transfer nip. While the transfer sheet P passes through the secondary transfer nip, the secondary transfer electric field formed at the secondary transfer nip formed between the secondary transfer roller 9 and the intermediate transfer belt 7 by the secondary transfer opposed roller 9a transfers the full color toner image formed on the surface of the intermediate transfer belt 7 onto the transfer sheet P.

The fixing device 12 is disposed downstream from the secondary transfer nip in the sheet conveyance direction S of the transfer sheet P. After the transfer sheet P passes through the secondary transfer nip, the transfer sheet P reaches the fixing device 12. The fixing device 12 fixes the full color toner image transferred onto the transfer sheet P thereon under heat and pressure. The transfer sheet P fixed with the full color toner image is output onto an outside of the apparatus body of the copier 500.

A transfer belt cleaner 11 collects residual toner failed to be transferred onto the transfer sheet P at the secondary transfer nip and therefore remaining on the surface of the intermediate transfer belt 7 therefrom.

As illustrated in FIG. 1, toner bottles 400Y, 400M, 400C, and 400K that contain yellow, magenta, cyan, and black toners, respectively, are disposed above the intermediate transfer belt 7. The toner bottles 400Y, 400M, 400C, and 400K are removably installed inside the apparatus body of the copier 500. The toner bottles 400Y, 400M, 400C, and 400K supply the yellow, magenta, cyan, and black toners contained therein to the developing devices 4 of the process cartridges 1Y, 1M, 1C, and 1K, respectively.

Figure 2:
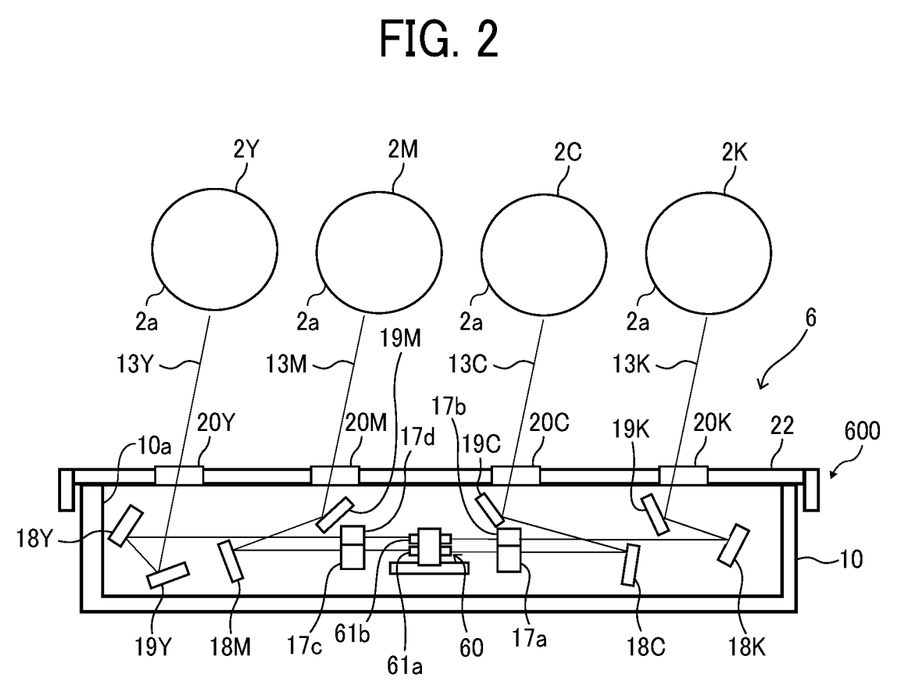
FIG. 2 is a schematic cross-sectional view of an optical writing unit incorporated in the copier depicted in FIG. 1.

FIG. 2 is a schematic cross-sectional view of the optical writing unit 6 serving as an optical scanner, illustrating a construction thereof. FIG. 2 illustrates a path of a laser beam that irradiates each of photoconductors 2Y, 2M, 2C, and 2K. Each of the photoconductors 2Y, 2M, 2C, and 2K is equivalent to the photoconductor 2 depicted in FIG. 1. The optical writing unit 6 includes light sources 71 depicted in FIG. 3, a first group of optical components, and polygon mirrors 61a and 61b. The first group of optical components guides light beams emitted from the light sources 71 to predetermined positions, respectively. Each of the polygon mirrors 61a and 61b serves as a deflector in which a mirror that rotates reflects the light beam guided by the first group of optical components so that the light beam scans the surface of the photoconductor 2Y, 2M, 2C, or 2K. The optical writing unit 6 further includes a second group of optical components and a housing body 10. The second group of optical components guides the light beam reflected by the polygon mirror 61a or 61b to a surface 2a of the photoconductor 2Y, 2M, 2C, or 2K. The surface 2a of each of the photoconductors 2Y, 2M, 2C, and 2K serves as a scanned face. The housing body 10 holds or supports the light sources 71, the first group of optical components, the polygon mirrors 61a and 61b, the second group of optical components, and the like.

For example, the optical writing unit 6 includes a polygon scanner 60 that includes the polygon mirrors 61a and 61b, serving as reflection mirrors, mounted on regular polygon side faces. The polygon scanner 60 serves as a rotary deflector that deflects the laser beam and causes the laser beam to scan the surface 2a of the photoconductor 2Y, 2M, 2C, or 2K in a main scanning direction as the polygon scanner 60 rotates at a high speed. The optical writing unit 6 further includes scan lenses 17a, 17b, 17c, and 17d that have an fθ correction function and an optical face tangle error correction function that change uniform angle motion of the light beam (e.g., a scan beam) reflected by the polygon scanner 60 to uniform linear motion. The uniform angle motion defines motion of the light beam reflected by the polygon mirror 61a or 61b that has uniform angles and rotates.

The optical writing unit 6 further includes first reflection mirrors 18Y, 18M, 18C, and 18K and second reflection mirrors 19Y, 19M, 19C, and 19K that guide the laser beams that have passed through the scan lenses 17a, 17b, 17c, and 17d to the photoconductors 2Y, 2M, 2C, and 2K, respectively. The optical writing unit 6 further includes dustproof glasses 20Y, 20M, 20C, and 20K disposed in optical paths where the laser beams reflected by the second reflection mirrors 19Y, 19M, 19C, and 19K and emitted toward an outside of the optical writing unit 6 pass, respectively. The dustproof glasses 20Y, 20M, 20C, and 20K prevent waste such as dust from falling into a housing 600 of the optical writing unit 6.

The optical writing unit 6 includes the housing 600 that includes the housing body 10 having an opening 10a. For example, the housing 600 includes the housing body 10 (e.g., an optical housing body) that serves as a base and a cover 22 that covers the opening 10a. The housing body 10 is an optical box made of resin, for example, and accommodates optical elements such as the polygon scanner 60, the scan lenses 17a, 17b, 17c, and 17d, the first reflection mirrors 18Y, 18M, 18C, and 18K, and the second reflection mirrors 19Y, 19M, 19C, and 19K. The cover 22 is also made of resin, for example. The cover 22 shields an interior of the housing body 10 accommodating the optical elements from an exterior of the housing body 10. As illustrated in FIG. 2, a single cover, that is, the cover 22, covers an entirety of the opening 10a. Alternatively, a plurality of covers each of which covers a part of the opening 10a may cover the entirety of the opening 10a. FIG. 2 illustrates optical paths 13Y, 13M, 13C, and 13K that indicate paths of the laser beams that irradiate the photoconductors 2Y, 2M, 2C, and 2K, respectively.

Figure 3:
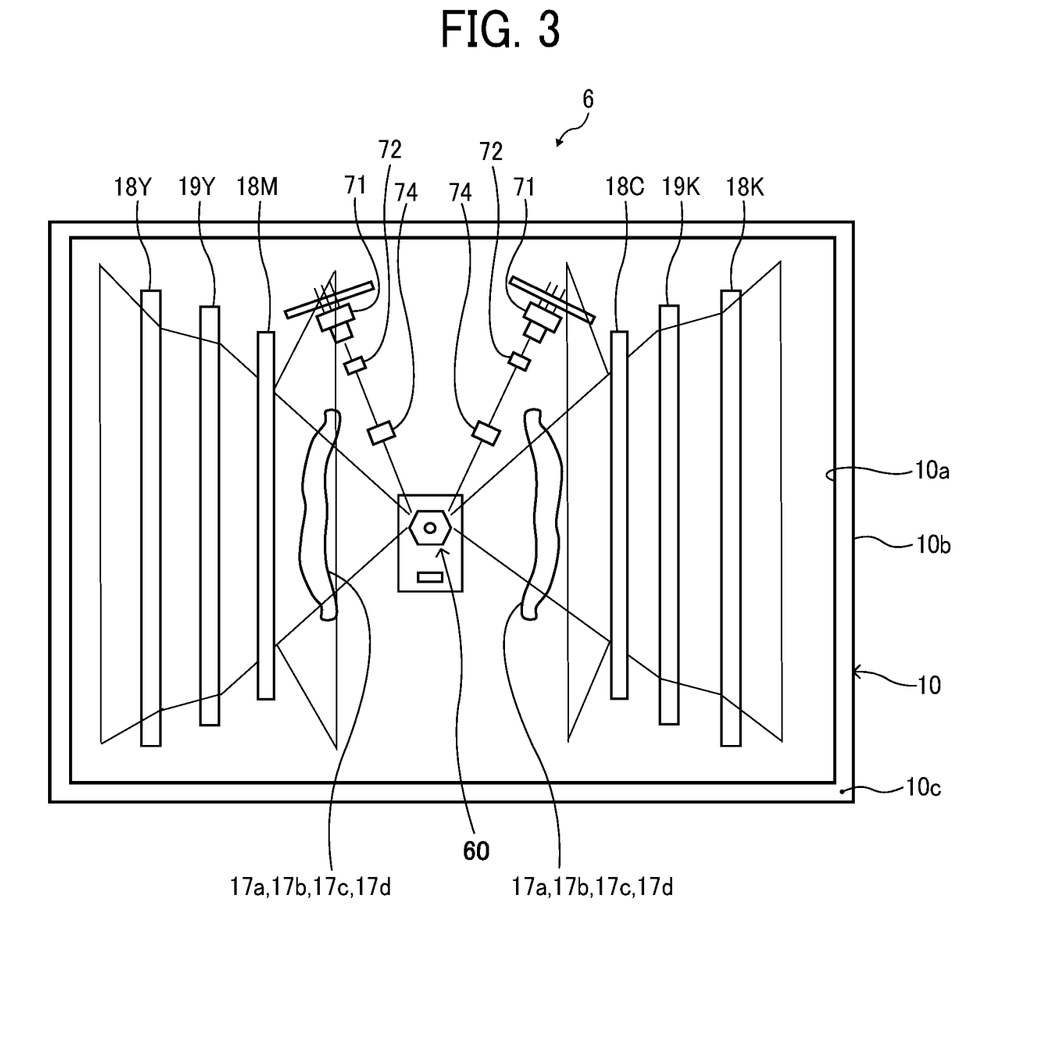
FIG. 3 is a plan view of the optical writing unit depicted in FIG. 2 from which a cover is removed.

FIG. 3 is a plan view of the optical writing unit 6 from which the cover 22 is removed. The housing body 10 includes the opening 10a disposed atop the housing body 10. The housing body 10 further includes a rib 10b serving as a peripheral wall and an end face 10c (e.g., a rim) being disposed at an upper end of the rib 10b and serving as a peripheral portion or an opening peripheral end face portion that abuts on the opening 10a and faces the cover 22. FIG. 3 illustrates an example of a construction of a pre-polygon optical system, that is, a pre-deflection optical system, through which the light beams emitted from the light sources 71 pass before the light beams irradiate the polygon mirrors 61a and 61b of the polygon scanner 60, respectively.

Each of the light sources 71 emits a light beam toward the polygon scanner 60. A coupling lens 72 (e.g., a collimator lens) converts the light beam from a divergent luminous flux to a parallel luminous flux. Thereafter, an aperture shapes the light beam. A cylindrical lens 74 condenses the shaped light beam in a sub-scanning direction. The condensed light beam irradiates the polygon mirror 61a or 61b of the polygon scanner 60. After an installation position of each of the coupling lenses 72 and the cylindrical lenses 74 is adjusted, the coupling lenses 72 and the cylindrical lenses 74 are attached to the housing body 10 with an adhesive. The coupling lens 72 and the cylindrical lens 74 construct a group of optical components before deflection (e.g., the first group of optical components) that forms a light beam path from the light source 71 to the polygon scanner 60 serving as the rotary deflector.

The polygon mirrors 61a and 61b of the polygon scanner 60 deflect the light beams that irradiate the polygon mirrors 61a and 61b toward the scan lenses 17a, 17b, 17c, and 17d. After the light beams penetrate through the scan lenses 17a, 17b, 17c, and 17d, the light beams irradiate the photoconductors 2Y, 2M, 2C, and 2K, respectively, as illustrated in FIG. 2, exposing the surfaces 2a of the photoconductors 2Y, 2M, 2C, and 2K. The scan lenses 17a, 17b, 17c, and 17d, the first reflection mirrors 18Y, 18M, 18C, and 18K, and the second reflection mirrors 19Y, 19M, 19C, and 19K construct a group of optical components after deflection (e.g., the second group of optical components) that forms light beam paths after the polygon scanner 60 serving as the rotary deflector reflects the light beams.

The optical writing unit 6 accommodates lenses (e.g., the scan lenses 17a, 17b, 17c, and 17d), mirrors (e.g., the first reflection mirrors 18Y, 18M, 18C, and 18K and the second reflection mirrors 19Y, 19M, 19C, and 19K), and transparent glasses (e.g., the dustproof glasses 20Y, 20M, 20C, and 20K). Accordingly, in order to prevent a foreign substance such as dust from entering the optical writing unit 6, the cover 22 or the like serving as a lid may cover the housing body 10 supporting the optical elements. Screws or the like may secure the cover 22 to the housing body 10, thus sealing the housing body 10. However, the polygon scanner 60 that rotates at a high speed may generate negative pressure inside the optical writing unit 6, generating an airflow that enters the optical writing unit 6 from the outside thereof. Although generation of the airflow varies depending on the number of rotations of the polygon scanner 60, even if the screws fasten the cover 22 to the housing body 10, the cover 22 may seal the housing body 10 weakly. Accordingly, the foreign substance may enter the optical writing unit 6, staining the polygon mirrors 61a and 61b and other optical components.

Figure 4:
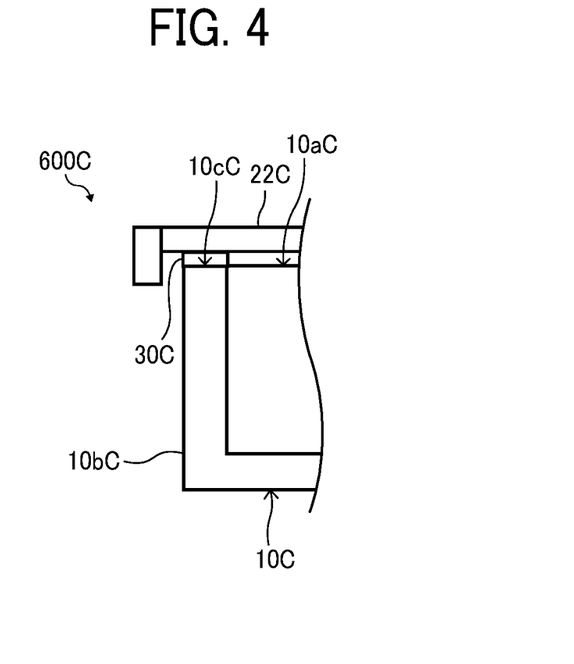
FIG. 4 is a diagram of a cover and a housing body of a comparative housing, illustrating a sealing method employed by the comparative housing.

Referring to FIG. 4, a description is provided of a construction of a comparative housing 600C.

As illustrated in FIG. 4, a seal 30C such as a sponge seal is disposed at an opposed portion interposed between a cover 22C and a housing body 10C. The seal 30C is pressed by fastening to seal the housing body 10C. FIG. 4 is a diagram illustrating a sealing method for sealing the housing body 10C. The housing body 10C includes a rib 10bC serving as a peripheral wall of the housing body 10C having an opening 10aC. The rib 10bC includes an end face 10cC. The end face 10cC of the rib 10bC and an inner wall of the cover 22C define the opposed portion. The seal 30C is disposed at the opposed portion. The seal 30C seals the housing body 10C readily. However, if the cover 22C and the housing body 10C have complex shapes, respectively, the number of materials of the seal 30C may increase, increasing manufacturing costs. Additionally, the seal 30C may be a double-sided adhesive tape that adheres to faces of counterparts (e.g., the cover 22C and the end face 10cC). If the seal 30C is soft, the seal 30C may cause assembly of the comparative housing 600C to be difficult. Hence, the double-sided adhesive tape having elasticity may be used as the seal 30C. Accordingly, the comparative housing 600C may suffer from increased manufacturing costs.

A description is provided of a construction of a comparative housing.

The comparative housing includes a seal made of a viscoelastic material. A cover includes an outer wall, an inner wall, and a bottom. The bottom includes an adhesion face sandwiched between the outer wall and the inner wall. The outer wall, the inner wall, and the adhesion face of the bottom define an enclosed portion. The viscoelastic material that is heated by a melter or the like to attain fluidity is poured into the enclosed portion, cooled, and cured. Thus, the seal having viscoelasticity is produced. The cover compresses the seal having viscoelasticity and is attached to a housing body of the comparative housing.

However, the seal may suffer from uneven thickness that degrades sealing or may deform the cover and the like.

Figure 5:
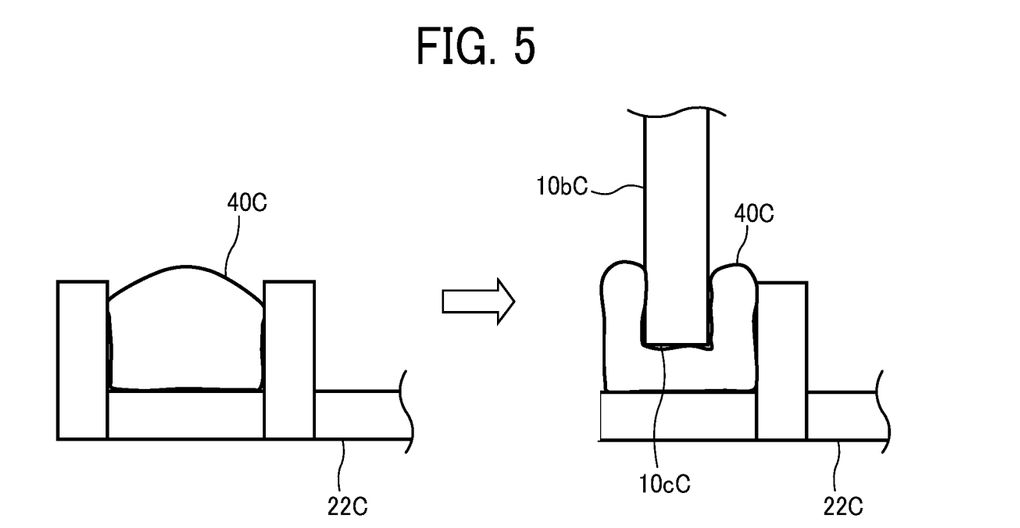
FIG. 5 is a diagram of the cover and the housing body of the comparative housing depicted in FIG. 4, illustrating another sealing method employed by the comparative housing.

Instead of the seal 30C, a hot-melt adhesive 40C may be used to seal the housing body 10C. FIG. 5 is a diagram illustrating a sealing method for sealing the housing body 10C with the hot-melt adhesive 40C. The hot-melt adhesive 40C is made of a thermoplastic resin produced as below. The melter heats and melts an original material. A semi-liquid agent is poured into the melted material by injection. The material is solidified gradually at an ambient temperature. The semi-liquid agent is applied to a sealing portion such as the cover 22C and the housing body 10C. After the semi-liquid agent is solidified, the cover 22C as a lid is fastened to the housing body 10C. Thus, the hot-melt adhesive 40C seals the housing body 10C with the cover 22C like the seal 30C.

The hot-melt adhesive 40C is advantageously applied to an arbitrary position by a gun that ejects the hot-melt adhesive 40C while scanning the cover 22C or the housing body 10C. Immediately after the gun (e.g., an ejection device or a discharge device) ejects the hot-melt adhesive 40C, the hot-melt adhesive 40C is liquid that adheres to the counterpart (e.g., the cover 22C or the housing body 10C) having any shape with an increased adhesion. Various types of the hot-melt adhesive 40C are available. Softness and tackiness after solidification are arbitrarily selected according to the type of the hot-melt adhesive 40C. Unlike the seal 30C, even if the cover 22C and the housing body 10C have the complex shapes, respectively, the number of materials of the hot-melt adhesive 40C does not increase. Costs change according to an amount of usage of the hot-melt adhesive 40C. Hence, even if the cover 22C and the housing body 10C have the complex shapes, respectively, the comparative housing 600C suppresses manufacturing costs.

Figure 6A:
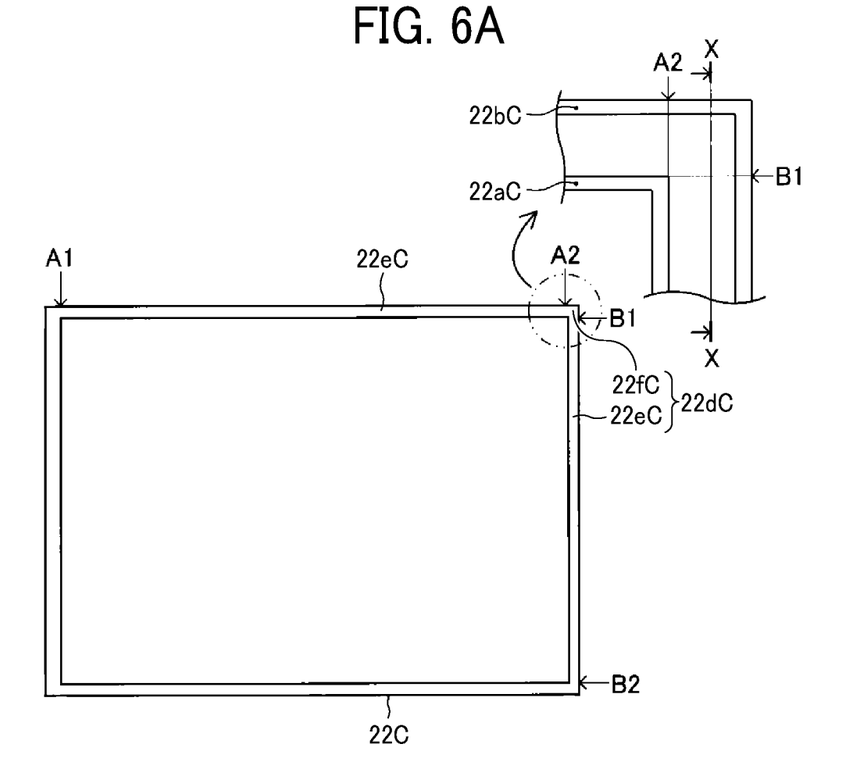
FIG. 6A is a plan view of the cover of the comparative housing depicted in FIG. 5.

As illustrated in FIG. 6A, the hot-melt adhesive 40C is disposed in a periphery of the cover 22C, that covers an entire periphery of the housing body 10C. An opposed portion 22dC in a peripheral region on an inner face of the cover 22C is disposed opposite an outer peripheral rib (e.g., the rib 10bC) serving as a peripheral portion or an opening peripheral end face portion of the housing body 10C. The hot-melt adhesive 40C is adhered to the opposed portion 22dC of the cover 22C. A robot causes the gun replenished with the melted hot-melt adhesive 40C to scan the cover 22C and to eject the hot-melt adhesive 40C in an arbitrary application amount at a constant speed, thus applying the hot-melt adhesive 40C to the opposed portion 22dC in the peripheral region on the inner face of the cover 22C. For example, as the robot causes the gun to scan the cover 22C and to eject the hot-melt adhesive 40C, the gun applies the hot-melt adhesive 40C to the cover 22C linearly.

However, since the robot changes a scanning direction of the gun at a corner of the cover 22C, a moving speed of the gun decreases temporarily and a moving direction of the gun changes at the corner of the cover 22C. As illustrated in FIG. 6A, the cover 22C includes linear portions 22eC and a corner portion 22fC. One of the linear portions 22eC defines a top side of the cover 22C in FIG. 6A and extends from a position A1 to a position A2. Another one of the linear portions 22eC defines a right side of the cover 22C in FIG. 6A and extends from a position B1 to a position B2. The corner portion 22fC is disposed between the linear portions 22eC. FIG. 6A also illustrates an enlarged view of the corner portion 22fC within a circle indicated with an alternate long and two short dashes line. In order to define an application region where the hot-melt adhesive 40C is applied, the cover 22C includes an inner rib 22aC and an outer rib 22bC. The inner rib 22aC is disposed closer to the opening 10aC than the outer rib 22bC is. The outer rib 22bC is disposed outside the inner rib 22aC. In other words, the outer rib 22bC is disposed opposite the opening 10aC via the inner rib 22aC.

Figure 6B:
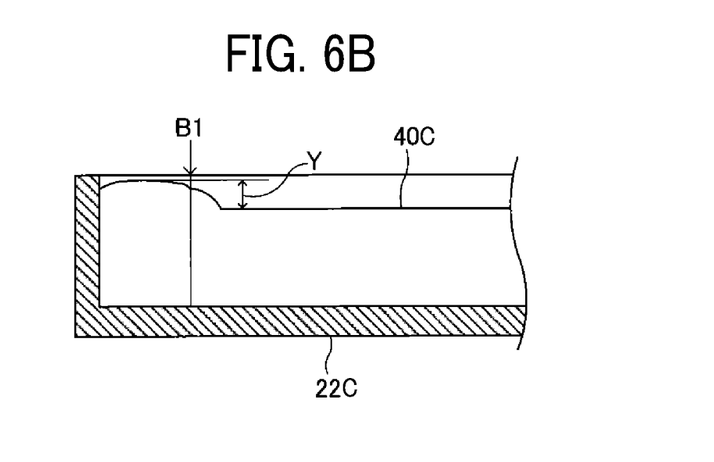
FIG. 6B is a cross-sectional view of the cover of the comparative housing depicted in FIG. 6A.

While the gun turns at the corner portion 22fC at the decreased moving speed, the gun continues application of the hot-melt adhesive 40C. Hence, the gun applies the hot-melt adhesive 40C to the corner portion 22fC with an increased application amount and an increased thickness of the hot-melt adhesive 40C compared to the linear portions 22eC. FIG. 6B is a cross-sectional view of the cover 22C taken on line X-X in FIG. 6A. Since the hot-melt adhesive 40C generates a thickness deviation Y at the corner portion 22fC, even if the hot-melt adhesive 40C is compressed and deformed as the cover 22C is fastened to the housing body 10C, the hot-melt adhesive 40C generates an increased repulsive force at the corner portion 22fC. Accordingly, the increased repulsive force deforms the housing body 10C substantially, degrading an optical property of the comparative housing 600C. Consequently, the comparative housing 600C may not attain a desired optical property. In order to reduce adverse effects caused by this circumstance, the gun may eject the hot-melt adhesive 40C in a decreased amount instead of a constant amount at a position in proximity to the corner portion 22fC. However, the gun may eject the hot-melt adhesive 40C at a position before the corner portion 22fC in the decreased amount, causing uneven thickness of the hot-melt adhesive 40C.

To address this circumstance of the comparative housing 600C, the housing 600 according to an embodiment of the present disclosure has a configuration described below. As illustrated in FIGS. 7A, 7B, 7C, and 8, a peripheral portion or an opening peripheral end face portion (e.g., the end face 10c) and a cover (e.g., the cover 22, a cover 22S, and a cover 22T) sandwich a seal (e.g., a hot-melt adhesive 40). Each of the peripheral portion and the cover has an opposed portion (e.g., opposed portions 22d, 22dS, and 22dT and the rib 10b) that defines a gap between the peripheral portion and the cover or a width of the seal. The opposed portion includes a corner portion (e.g., corner portions 22f, 22fS, and 22fT and a corner rib 10b1) and a linear portion (e.g., linear portions 22e, 22eS, and 22eT and a linear rib 10b2). The linear portion abuts on or communicates with the corner portion. The corner portion of at least one of the peripheral portion and the cover has a first shape that defines the gap between the peripheral portion and the cover or the width of the seal. The linear portion of the at least one of the peripheral portion and the cover has a second shape that defines the gap between the peripheral portion and the cover or the width of the seal. The second shape of the linear portion is different from the first shape of the corner portion.

Figure 7A:
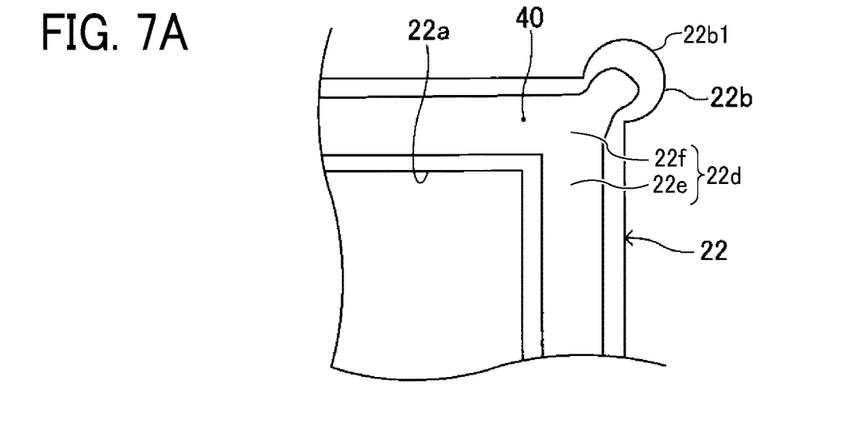
FIG. 7A is a plan view of the cover of the optical writing unit depicted in FIG. 2 as a first example of a sealing construction of the optical writing unit.
Figure 7B:
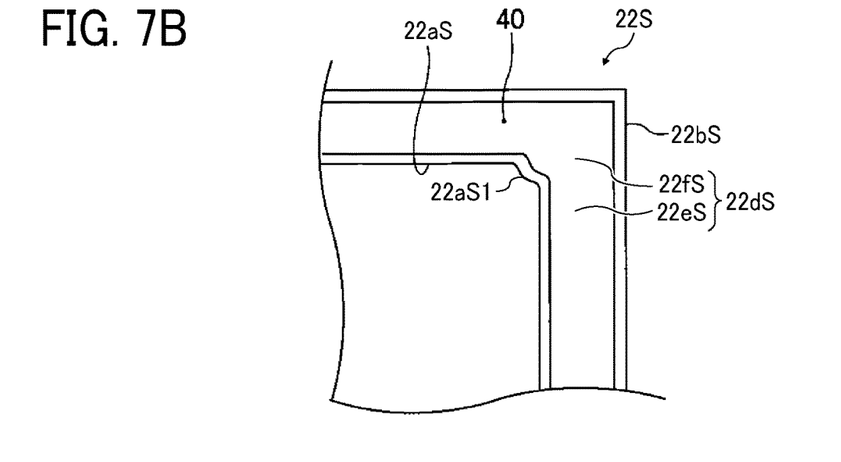
FIG. 7B is a plan view of a cover installable in the optical writing unit depicted in FIG. 2 as a second example of the sealing construction.
Figure 7C:
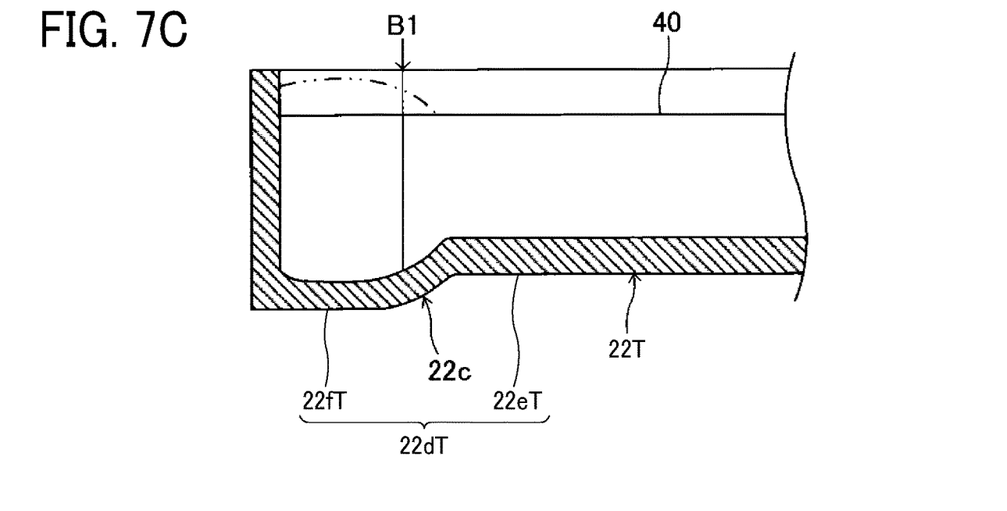
FIG. 7C is a cross-sectional view of a cover installable in the optical writing unit depicted in FIG. 2 as a third example of the sealing construction.

FIGS. 7A, 7B, and 7C illustrate examples of a construction in which the shape of the corner portion of the cover or the peripheral portion of the housing body 10 is different from the shape of the linear portion thereof, thus eliminating uneven thickness of the seal. The corner portion and the linear portion define the gap between the peripheral portion and the cover or the width of the seal. As a first example of the construction, as illustrated in FIG. 7A, the cover 22 includes an inner rib 22a and an outer rib 22b. The outer rib 22b includes a bulge 22b1 that is disposed in the corner portion 22f and bulged outward. The bulge 22b1 projects in a direction separating or away from the opening 10a. The bulge 22b1 of the outer rib 22b increases an area where the hot-melt adhesive 40 spreads, decreasing a thickness of the hot-melt adhesive 40. As a bulge amount of the bulge 22b1 that bulges outward increases, the thickness of the hot-melt adhesive 40 decreases. The bulge amount of the bulge 22b1 is determined based on the moving speed of the gun held by the robot and an amount of thickness deviation caused by the moving speed of the gun.

Instead of the bulge 22b1 of the outer rib 22b, that bulges outward, an inner rib 22aS may include a recess 22aS1 that achieves a similar advantage. As a second example of the construction, as illustrated in FIG. 7B, the cover 22S includes the inner rib 22aS and an outer rib 22bS. The inner rib 22aS includes the recess 22b1 disposed in the corner portion 22fS, instead of a square corner. The recess 22aS1 disposed in the corner portion 22fS spreads the hot-melt adhesive 40, suppressing uneven thickness of the hot-melt adhesive 40.

As illustrated in FIGS. 7A and 7B, each of the inner ribs 22a and 22aS and each of the outer ribs 22b and 22bS sandwich an application region where the hot-melt adhesive 40 is applied. Each of the inner ribs 22a and 22aS and each of the outer ribs 22b and 22bS define a width of the hot-melt adhesive 40 applied in the application region. For example, as illustrated in FIG. 7A, the bulge 22b1 bulging outward suppresses uneven thickness of the hot-melt adhesive 40 effectively. However, the cover 22 may not include the inner rib 22a, the outer rib 22b, and the bulge 22b1 due to a layout of the cover 22. In this case, as a third example of the construction, as illustrated in FIG. 7C, the cover 22T includes a slope 22c disposed on a bottom face of the cover 22T, that is applied with the hot-melt adhesive 40, and disposed in the corner portion 22fT at a position in proximity to a corner of the cover 22T. The slope 22c lowers the bottom face, serving as an application face, of the cover 22T in a thickness direction of the hot-melt adhesive 40. The slope 22c increases a depth of the corner portion 22fT in the thickness direction of the hot-melt adhesive 40 relative to a depth of the linear portion 22eT. As the application face lowers, a top of the hot-melt adhesive 40 lowers. As a result, the top of the hot-melt adhesive 40 is even, eliminating uneven repulsive force. Two or more of the first example depicted in FIG. 7A, the second example depicted in FIG. 7B, and the third example depicted in FIG. 7C may be combined.

Figure 8:
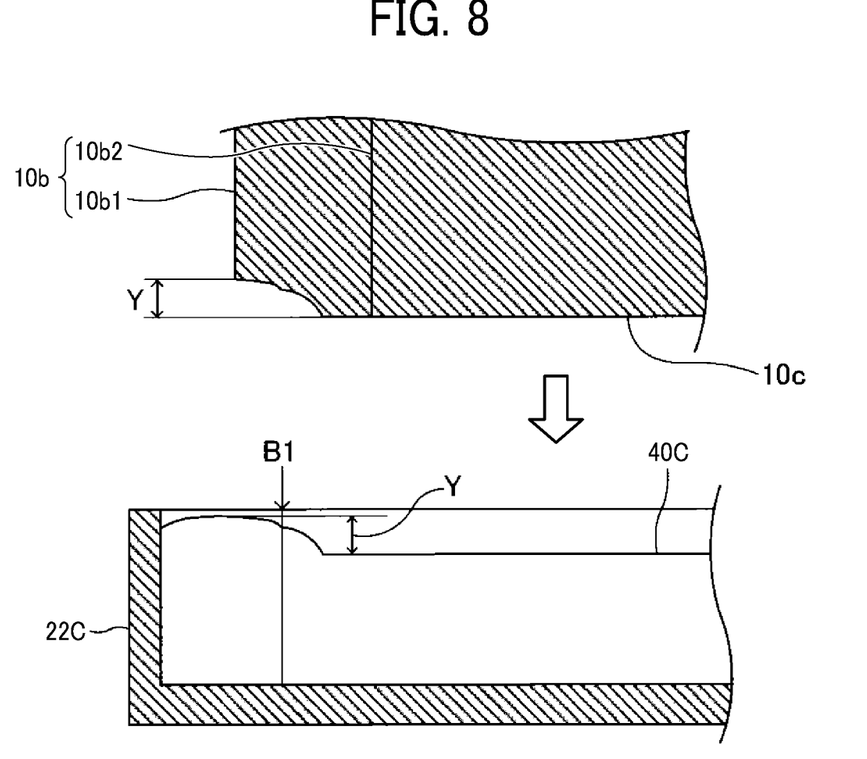
FIG. 8 is a diagram of a rib of a housing of the optical writing unit depicted in FIG. 3 as a fourth example of the sealing construction.

The covers 22, 22S, and 22T depicted in FIGS. 7A, 7B, and 7C include the bulge 22b1, the recess 22aS1, and the slope 22c, respectively, that eliminate uneven thickness and uneven top of the hot-melt adhesive 40, thus suppressing deformation of the housing body 10 and the like. Alternatively, a height of the rib 10b of the housing body 10 may be lowered to achieve similar advantages. The rib 10b serves as an opposed portion (e.g., an opposed face) of the housing body 10, that is disposed opposite the cover 22C. FIG. 8 illustrates an example of the construction in which the rib 10b serves as the opposed portion of the housing body 10, that is disposed opposite the cover 22C. The rib 10b includes the corner rib 10b1 serving as a corner portion of the rib 10b and the linear rib 10b2 serving as a linear portion of the rib 10b. A height of the corner rib 10b1 is smaller than a height of the linear rib 10b2 by the thickness deviation Y. FIG. 8, in a lower part thereof, illustrates a cross-sectional view of the cover 22C depicted in FIG. 6B. FIG. 8, in an upper part thereof, illustrates a cross-sectional view of the rib 10b serving as the opposed portion of the housing body 10, that is disposed opposite the cover 22C. In the examples depicted in FIGS. 7C and 8, a gap between a housing body (e.g., the housing body 10) and a cover (e.g., the covers 22T and 22C) in an opposed portion (e.g., the opposed portion 22dT and the rib 10b) is greater at a corner portion (e.g., the corner portion 22fT and the corner rib 10b1) than at a linear portion (e.g., the linear portion 22eT and the linear rib 10b2).

Figure 9A:
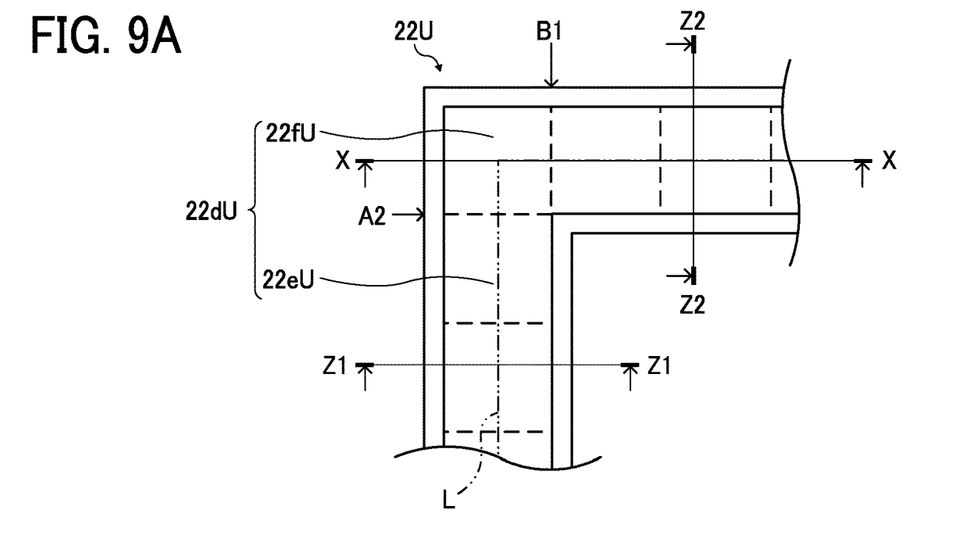
FIG. 9A is a plan view of a cover installable in the optical writing unit depicted in FIG. 2 as a fifth example of the sealing construction.
Figure 9B:
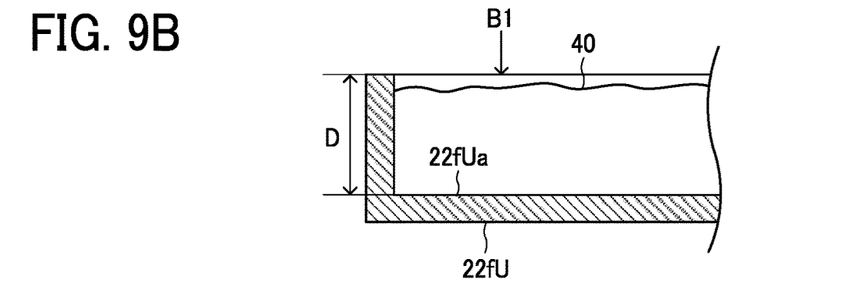
FIG. 9B is a cross-sectional view of a corner portion of the cover depicted in FIG. 9A.
Figure 9C:
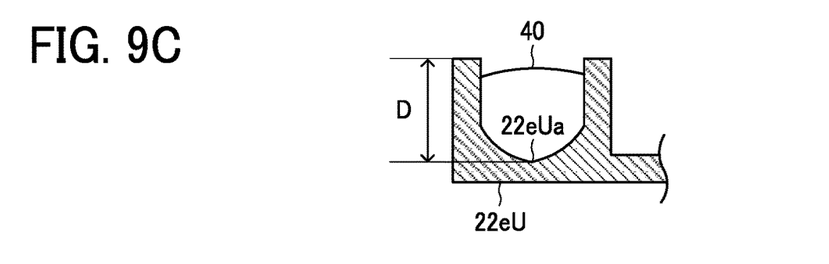
FIG. 9C is a cross-sectional view of a linear portion of the cover depicted in FIG. 9A.

FIGS. 9A, 9B, and 9C illustrate another example of the construction in which a peripheral portion or an opening peripheral end face portion (e.g., the end face 10c) and a cover (e.g., a cover 22U) sandwich a seal (e.g., the hot-melt adhesive 40). Each of the peripheral portion and the cover has a shape (e.g., an opposed portion 22dU) that defines the width of the seal. The opposed portion includes a corner portion (e.g., a corner portion 22fU) and a linear portion (e.g., a linear portion 22eU) abutting on or communicating with the corner portion. The corner portion of at least one of the peripheral portion and the cover has a first shape that defines the width of the seal. The linear portion of the at least one of the peripheral portion and the cover has a second shape that defines the width of the seal. The second shape of the linear portion is different from the first shape of the corner portion. In the example of the construction illustrated in FIGS. 9A, 9B, and 9C, in a plan view, a width of the corner portion 22fU is equivalent to a width of the linear portion 22eU as illustrated in FIG. 9A. Conversely, a depth of the corner portion 22fU is different from a depth of the linear portion 22eU in a gapping direction between the peripheral portion (e.g., the end face 10c of the housing body 10) and the cover 22U. FIG. 9C is a cross-sectional view of the linear portion 22eU taken on line Z1-Z1 or line Z2-Z2 in FIG. 9A. In a cross section perpendicular to a scanning line L of the gun, an arcuate application face 22eUa (e.g., a bottom face) of the linear portion 22eU is curved in an arc having a center that defines a depth D that is deepest. Conversely, FIG. 9B is a cross-sectional view of the corner portion 22fU taken on line X-X in FIG. 9A. The corner portion 22fU includes a flat, square application face 22fUa (e.g., a bottom face). An entirety of the square application face 22fUa defines the depth D uniformly. Thus, the corner portion 22fU holds the hot-melt adhesive 40 in an amount per unit in the scanning line L, which is greater than that of the linear portion 22eU, suppressing uneven top of the hot-melt adhesive 40. Although FIGS. 9A, 9B, and 9C illustrate the corner portion 22fU and the linear portion 22eU of the cover 22U, the corner portion 22fU and the linear portion 22eU are also applicable to the housing body 10.

According to the embodiments described above, the hot-melt adhesive 40 is applied linearly on an opposed portion (e.g., the opposed portions 22d, 22dS, 22dT, and 22dU) of a cover (e.g., the covers 22, 22S, 22T, and 22U) before an opposed portion (e.g., the rib 10b) of the housing body 10. Alternatively, the hot-melt adhesive 40 may be applied to the opposed portion (e.g., the rib 10b) of the housing body 10 before the cover. The embodiments described above are applied to a housing (e.g., the housing 600) of an optical scanner (e.g., the optical writing unit 6). Alternatively, the embodiments described above may be applied to a housing of other device.

A description is provided of advantages of a housing (e.g., the housing 600).

As illustrated in FIGS. 2, 3, and 7A, the housing includes a body (e.g., the housing body 10), a cover (e.g., the covers 22, 22S, 22T, and 22U), and a seal (e.g., the hot-melt adhesive 40). The body has an opening (e.g., the opening 10a) and includes a peripheral portion (e.g., the end face 10c) that abuts on the opening. The cover covers an entirety or a part of the opening. The seal is sandwiched between the cover and the peripheral portion of the body. The cover and the peripheral portion of the body sandwich the seal. Each of the cover and the peripheral portion of the body includes an opposed portion (e.g., the opposed portions 22d, 22dS, 22dT, and 22dU and the rib 10b) that defines a gap between the cover and the peripheral portion of the body or a width of the seal. The opposed portion includes a corner portion (e.g., the corner portions 22f, 22fS, 22fT, and 22fU and the corner rib 10b1) and a linear portion (e.g., the linear portions 22e, 22eS, 22eT, and 22eU and the linear rib 10b2). The linear portion abuts on or communicates with the corner portion. The corner portion has a first shape that defines the gap between the cover and the peripheral portion of the body or the width of the seal. The linear portion has a second shape that defines the gap between the cover and the peripheral portion of the body or the width of the seal. The second shape of the linear portion is different from the first shape of the corner portion. For example, the second shape is different from the first shape at at least one of a first position disposed on the peripheral portion of the body and a second position that is disposed on the cover and disposed opposite the first position.

Accordingly, the corner portion and the linear portion prevent uneven thickness of the seal, suppressing degradation in sealing by the seal and deformation of the cover and the like.

According to the embodiments described above, the copier 500 serves as an image forming apparatus. Alternatively, the image forming apparatus may be a printer, a facsimile machine, a multifunction peripheral (MFP) having at least two of printing, copying, facsimile, scanning, and plotter functions, an inkjet recording apparatus, or the like.

The above-described embodiments are illustrative and do not limit the present disclosure. Thus, numerous additional modifications and variations are possible in light of the above teachings. For example, elements and features of different illustrative embodiments may be combined with each other and substituted for each other within the scope of the present disclosure.

Any one of the above-described operations may be performed in various other ways, for example, in an order different from the one described above.

What is claimed is:

1. A housing comprising:
   a body having an opening, the body including a peripheral portion configured to abut on the opening;
   a cover configured to cover at least a part of the opening; and
   a seal sandwiched between the cover and the peripheral portion of the body,
   at least one of the cover and the peripheral portion of the body including:
      a corner portion configured to have a first shape that defines one of a gap between the cover and the peripheral portion of the body and a width of the seal; and
      a linear portion configured to abut on the corner portion, the linear portion configured to have a second shape that defines the one of the gap between the cover and the peripheral portion of the body and the width of the seal, the second shape being different from the first shape at at least one of a first position disposed on the peripheral portion of the body and a second position that is disposed on the cover and disposed opposite the first position,
   wherein the corner portion includes a slope configured to increase a depth of the corner portion in a thickness direction of the seal relative to a depth of the linear portion.

2. The housing according to claim 1,
   wherein a width of the corner portion is greater than a width of the linear portion.

3. The housing according to claim 2,
   wherein each of the corner portion and the linear portion includes:
   a first rib; and
   a second rib disposed opposite the opening via the first rib.

4. The housing according to claim 3,
   wherein the first rib of the corner portion includes a recess recessed toward the opening.

5. The housing according to claim 3,
   wherein the second rib of the corner portion includes a bulge projected in a direction away from the opening.

6. The housing according to claim 1,
   wherein the seal includes a hot-melt adhesive linearly applied to the corner portion and the linear portion.

7. The housing according to claim 6,
   wherein one of the cover and the peripheral portion of the body includes the corner portion having the first shape and the linear portion having the second shape, and
   wherein the hot-melt adhesive is applied to the one of the cover and the peripheral portion of the body.

8. The housing according to claim 1,
   wherein the seal is configured to seal the gap between the cover and the peripheral portion of the body under compression and deformation caused by the cover attached to the body.

9. The housing according to claim 1, further comprising:
   an optical scanner comprising:
   a light source configured to emit a light beam; and
   a deflector configured to deflect the light beam,
   the housing configured to accommodate the light source and the deflector.

10. The housing according to claim 1, further comprising:
    an image forming apparatus comprising:
    an image bearer configured to bear an image,
    the housing disposed opposite the image bearer.

11. A housing comprising:
    a body having an opening, the body including a peripheral portion configured to abut on the opening;
    a cover configured to cover at least a part of the opening; and a seal sandwiched between the cover and the peripheral portion of the body,
at least one of the cover and the peripheral portion of the body including:
   a corner portion configured to have a first shape that defines one of a gap between the cover and the peripheral portion of the body and a width of the seal; and
   a linear portion configured to abut on the corner portion, the linear portion configured to have a second shape that defines the one of the gap between the cover and the peripheral portion of the body and the width of the seal, the second shape being different from the first shape at at least one of a first position disposed on the peripheral portion of the body and a second position that is disposed on the cover and disposed opposite the first position,
wherein the linear portion of the body includes a linear rib and the corner portion of the body includes a corner rib, and
wherein a height of the corner rib is smaller than a height of the linear rib.

12. A housing comprising:
a body having an opening, the body including a peripheral portion configured to abut on the opening;
a cover configured to cover at least a part of the opening; and
a seal sandwiched between the cover and the peripheral portion of the body,
at least one of the cover and the peripheral portion of the body including:
   a corner portion configured to have a first shape that defines one of a gap between the cover and the peripheral portion of the body and a width of the seal; and
a linear portion configured to abut on the corner portion, the linear portion configured to have a second shape that defines the one of the gap between the cover and the peripheral portion of the body and the width of the seal, the second shape being different from the first shape at at least one of a first position disposed on the peripheral portion of the body and a second position that is disposed on the cover and disposed opposite the first position,
wherein the linear portion has an arcuate bottom face curved in an arc having a center that defines a predetermined depth, and
wherein the corner portion has a flat bottom face configured to define the predetermined depth uniformly.

* * * * *